United States Patent [19]
Ishihara et al.

[11] Patent Number: 5,021,100
[45] Date of Patent: Jun. 4, 1991

[54] TANDEM SOLAR CELL

[75] Inventors: Takashi Ishihara; Hajime Sasaki; Masao Aiga, all of Itami, Japan

[73] Assignee: Mitsubishi Denki Kabushiki Kaisha, Japan

[21] Appl. No.: 449,009

[22] Filed: Dec. 12, 1989

[30] Foreign Application Priority Data

Mar. 10, 1989 [JP] Japan .................................. 1-58761

[51] Int. Cl.$^5$ .................. H01L 31/052; H01L 31/075; H01L 31/078
[52] U.S. Cl. .................................... 136/249; 136/258; 136/259
[58] Field of Search ................ 136/249 TJ, 258 AM, 136/258 PC, 259

[56] References Cited

U.S. PATENT DOCUMENTS 4,680,422 7/1987 Stanbery ...................... 136/249 TJ

FOREIGN PATENT DOCUMENTS

| 60-35580 | 6/1984 | Japan | 136/249 TJ |
| 59-96777 | 6/1984 | Japan | 136/249 TJ |
| 61-1062 | 1/1986 | Japan | 136/249 TJ |
| 61-12086 | 1/1986 | Japan | 136/249 TJ |
| 63-77167 | 4/1988 | Japan | 136/249 TJ |

Primary Examiner—Aaron Weisstuch
Attorney, Agent, or Firm—Leydig, Voit & Mayer

[57] ABSTRACT

A multiple cell photovoltaic device includes first and second serially connected solar cells and a conductive or dielectric selective reflection film therebetween. The thickness of the selective reflection film is chosen to reflect short wavelength light which may be absorbed by the second solar cell and to transmit long wavelength light which is not absorbed by the second solar cell and may be absorbed by the first solar cell. When the selective reflection film comprises a dielectric material, apertures are provided in the selective reflection film for serial electrical connection of the two cells.

15 Claims, 4 Drawing Sheets

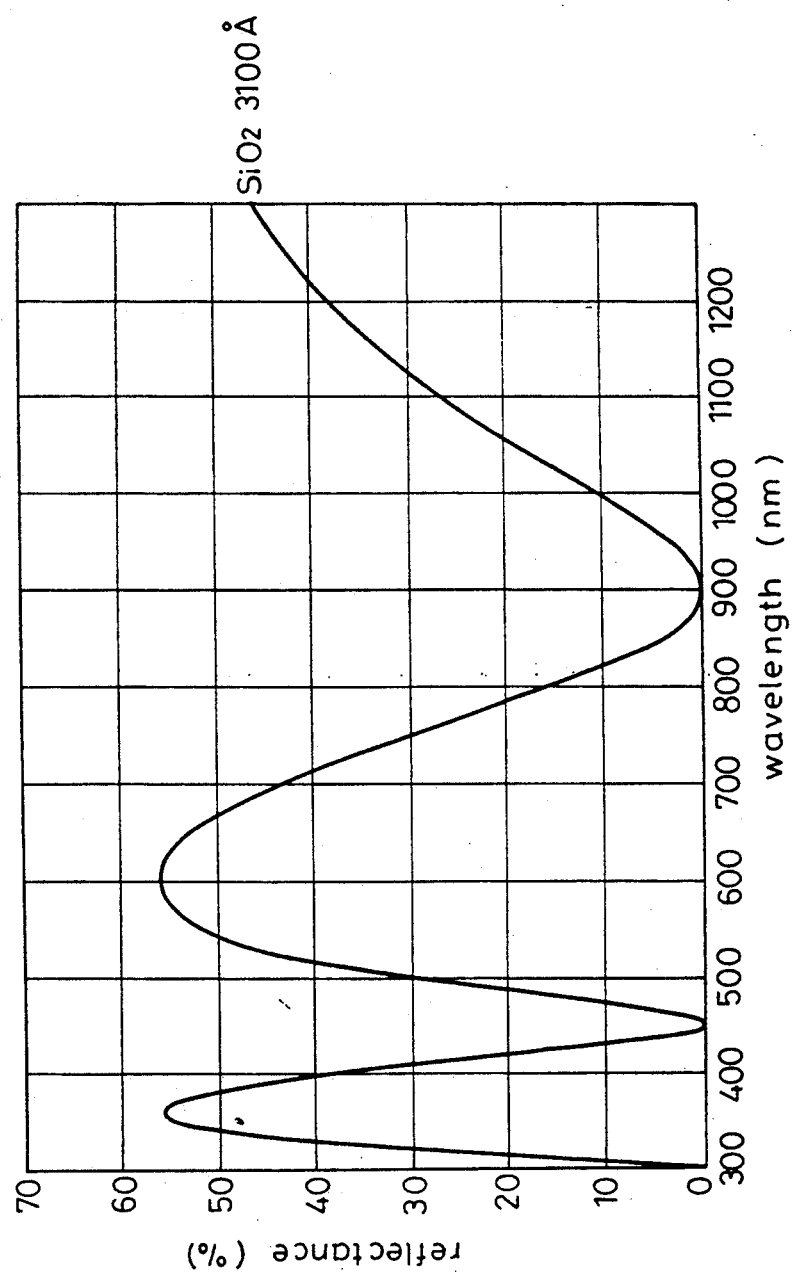

TANDEM SOLAR CELL

FIELD OF THE INVENTION

The present invention relates to a multiple cell photovoltaic device and, more particularly, to an improvement in the efficiency thereof.

BACKGROUND OF THE INVENTION

FIG. 5 shows a prior art multiple cell photovoltaic device shown in "Technical Digest of 2nd International Photovoltaic Science and Engineering Conference" (PVSEC-II, 1986, Peking), page 395. In FIG. 5, reference numeral 1 designates p-type polycrystalline silicon. N-type amorphous silicon 2 is disposed on the p-type polycrystalline silicon 1. P-type amorphous silicon 3 is disposed on the n-type amorphous silicon 2. Intrinsic amorphous silicon 4 is disposed on the p-type amorphous silicon 3. N-type monocrystalline silicon 5 is disposed on the intrinsic amorphous silicon 4. A transparent conductive film 6 constituting a front surface electrode is disposed on the n-type monocrystalline silicon 5. Light is incident on the device from the side of the transparent electrode 6. A rear surface Al electrode 7 is disposed on the p-type polycrystalline silicon 1. Reference numeral 11 designates a first solar cell and reference numeral 12 designates a second solar cell. These two solar cells are connected in series.

The incident light is transmitted through the transparent conductive film 6, and the short wavelength light is converted into photo-generated carriers in the intrinsic amorphous silicon 4 of the second solar cell 12 while the long wavelength light is converted into photo-generated carriers in the p-type polysilicon 1 of the first solar cell 11. These -.photo-generated carriers flow and are collected at the respective junctions, thereby generating currents. When the intrinsic amorphous silicon 4 is thick, the light absorbed by the second solar cell 12 is increased. However, the quality of the intrinsic amorphous silicon 4 is poor and there is, therefore, an upper limit to the film thickness of the intrinsic amorphous silicon 4. Therefore, even light having an energy larger than the energy band gap of the intrinsic amorphous silicon 4 of the second solar cell 12 is not completely absorbed and is transmitted to the first solar cell 11 where it generates a current.

In this way, the external current of a solar cell having a first and second solar cell serially connected with each other is restricted by the lower of the cell currents of the two cells. However, in a p-i-n cell comprising amorphous silicon, as is usually used for the second solar cell, the short-circuit current density is about 15 to 17 mA/cm$^2$. On the other hand, the short-circuit current density of the crystalline silicon of the first solar cell is about 36 to 40 mA/cm$^2$. A short-circuit current density of about 20 to 25 mA/cm$^2$ is generated by the light which is transmitted to the second solar cell without being absorbed in the first solar cell. Therefore, the external current density is restricted to about 15 to 17 mA/cm$^2$ which is the photocurrent generated in the second solar cell. The photocurrents of the serially connected cells are unbalanced, thereby reducing the photovoltaic conversion efficiency of the structure. The photovoltaic conversion efficiency in this case is about 14 to 16%.

On the other hand, as disclosed in Japanese Published patent application No. 59-96777, even if a transparent film is inserted between the first solar cell and the second solar cell, without considering the reflection characteristics of the film, balancing of the photocurrents is not effected, and the photovoltaic conversion efficiency is not enhanced.

In Japanese Published patent application No. 60-35580, an ITO (indium tin oxide) layer 1000 to 1500 Angstroms thick is inserted between the first solar cell and the second solar cell. FIG. 6 shows the reflection characteristics in this case. As is apparent from this figure, the reflected light is effectively utilized in the cell at the light incident side. In the lower cell, however, the incident light intensity is reduced to a great extent by the insertion of the ITO film.

Furthermore, as shown in Japanese Published patent application No. 63-77167, it is impossible to effectively utilize the light even when the film thickness of the ITO is 100 to 2000 Angstroms. Especially in an ITO layer 600 Angstroms thick, as disclosed in Japanese Published patent application No. 63-77167, the reflection characteristic is broad and the response to the longer wavelengths of the lower cell is significantly reduced, as shown in FIG. 7. Thus, effective utilization of light is impossible.

SUMMARY OF THE INVENTION

It is an object of the present invention to provide a multiple cell photovoltaic device balancing the currents generated in the respective cells, thereby enhancing the photovoltaic conversion efficiency, by controlling the thickness of a selective reflection film.

Other objects and advantages of the present invention will become apparent from the detailed description given hereinafter. It should be understood, however, that the detailed description and specific embodiments are given by way of illustration only, since various changes and modifications within the spirit and scope of the invention will become apparent from the detailed description.

According to an aspect of the present invention, a conductive selective reflection film having a thickness such that short wavelength light which is absorbed by the second solar cell is selectively reflected and that long wavelength light which is not absorbed by the second solar cell and is absorbed by the first solar cell is transmitted to the first cell is inserted between first and second serially connected solar cells. Therefore, the photocurrent generated in the second solar is increased without reducing the photocurrent generated in the first solar cell, thereby balancing the photocurrents generated in the respective cells.

According to another aspect of the present invention, the selective reflection film comprises a dielectric material with apertures disposed at desired portions thereof. Therefore, serial connection of the first and second solar cells can be easily achieved through the apertures.

BRIEF DESCRIPTION OF THE DRAWINGS

FIG. 4 is a diagram showing the reflection characteristics of the photovoltaic device of FIG. 3 in which an $SiO_2$ film 3100 Angstroms thick is used as a selective reflection film;

DETAILED DESCRIPTION OF THE PREFERRED EMBODIMENTS

Figure 1:
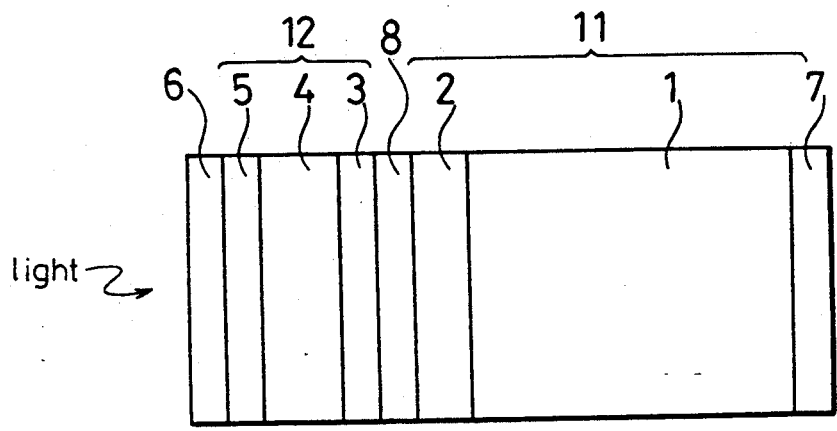
FIG. 1 is a cross-sectional view showing a multiple cell photovoltaic device according to a first embodiment of the present invention.

FIG. 1 shows a cross-sectional view of a multiple cell photovoltaic device according to a first embodiment of the present invention. In FIG. 1, reference numeral 1 designates p-type polysilicon about 10 to 400 microns thick. N-type amorphous or microcrystalline silicon 2 about 100 to 2000 Angstroms thick is disposed on the p-type polysilicon 1. A selective reflection film 8 about 2500 Angstroms thick comprising ITO is disposed on the n-type amorphous or microcrystalline silicon 2. P-type amorphous or microcrystalline silicon 3 about 100 to 500 Angstroms thick is disposed on the selective reflection film 8. Intrinsic amorphous silicon 4, 3000 to 6000 Angstroms thick, is disposed on the p-type amorphous or microcrystalline silicon 3. N-type amorphous or microcrystalline silicon 5 about 100 to 300 Angstroms thick is disposed on the intrinsic amorphous silicon 4. A transparent front surface electrode 6 about 500 to 800 Angstroms thick is disposed on the n-type amorphous or microcrystalline silicon 5. A rear surface Al electrode 7 is disposed on the p-type polysilicon 1. Reference numeral 11 designates a first or lower solar cell, and reference numeral 12 designates a second or upper solar cell. These two solar cells are serially connected via a selective reflection film 8.

The p-type polysilicon 1 is produced by casting, CVD (chemical vapor deposition), or LPE (liquid phase epitaxy), and the amorphous or microcrystalline films 2 and 5 are produced by PCVD (plasma CVD), photo-assisted CVD, or ECR (electron cyclotron resonance)—CVD. The transparent electrode 6 is produced by sputtering or electron beam deposition.

The light is incident on the second solar cell 12 through the transparent electrode 6. Almost all of the short wavelength light, i.e., below about 500 nm in wavelength, is absorbed therein, and the longer wavelength light is transmitted through the second solar cell 12. Light of wavelengths which can be absorbed by the second solar cell is selectively reflected at the selective reflection film 8.

The method of calculating the reflectance of the selective reflection film is disclosed in "Proceedings of the 2nd Photovoltaic Science and Engineering Conference in Japan, 1980", *Japanese Journal of Applied Physics*, Volume 20, Supplement 20-2, pages 99–103(1981).

$$R(\lambda) = \frac{A}{B}$$

$$A = r_1^2 + r_2^2 + r_3^2 + r_1^2 r_2^2 r_3^2 +$$
$$2r_1 r_2(1 + r_3^2)\cos 2\theta_1 + 2r_2 r_3(1 + r_1^2)\cos 2\theta_2 +$$
$$2r_1 r_3 \cos 2(\theta_1 + \theta_2) + 2r_1 r_2^2 r_3 \cos 2(\theta_1 - \theta_2)$$

$$B = 1 + r_1^2 r_2^2 + r_1^2 r_3^2 + r_2^2 r_3^2 +$$
$$2r_1 r_2(1 + r_2^2)\cos 2\theta_1 + 2r_2 r_3(1 + r_1^2)\cos 2\theta_2 +$$
$$2r_1 r_3 \cos 2(\theta_1 + \theta_2) + 2r_1 r_2^2 r_3 \cos 2(\theta_1 - \theta_2)$$

Herein,
$R(\lambda)$ = reflectance at the wavelength $\lambda$
$r_1 = (n_0 - n_1)/(n_0 + n_1)$
$r_2 = (n_1 - n_2)/(n_1 + n_2)$
$r_3 = (n_2 - n_3)/(n_2 + n_3)$
$\theta_1 = 2n_1 d_1/\lambda$
$\theta_2 = 2n_2 d_2/\lambda$
$n_0$ = refractive index of air
$n_1$ = refractive index of silicon
$n_2$ = refractive index of the selective reflection film
$n_3$ = refractive index of silicon
$d_1$ = thickness of silicon at the light incident side
$d_2$ = thickness of the selection reflection film.

In this embodiment, for simplifying the calculation, the selective reflection film is assumed to comprise ITO with a refractive index of 1.77 which is between silicon films having refractive indices of 3.8.

Figure 2:
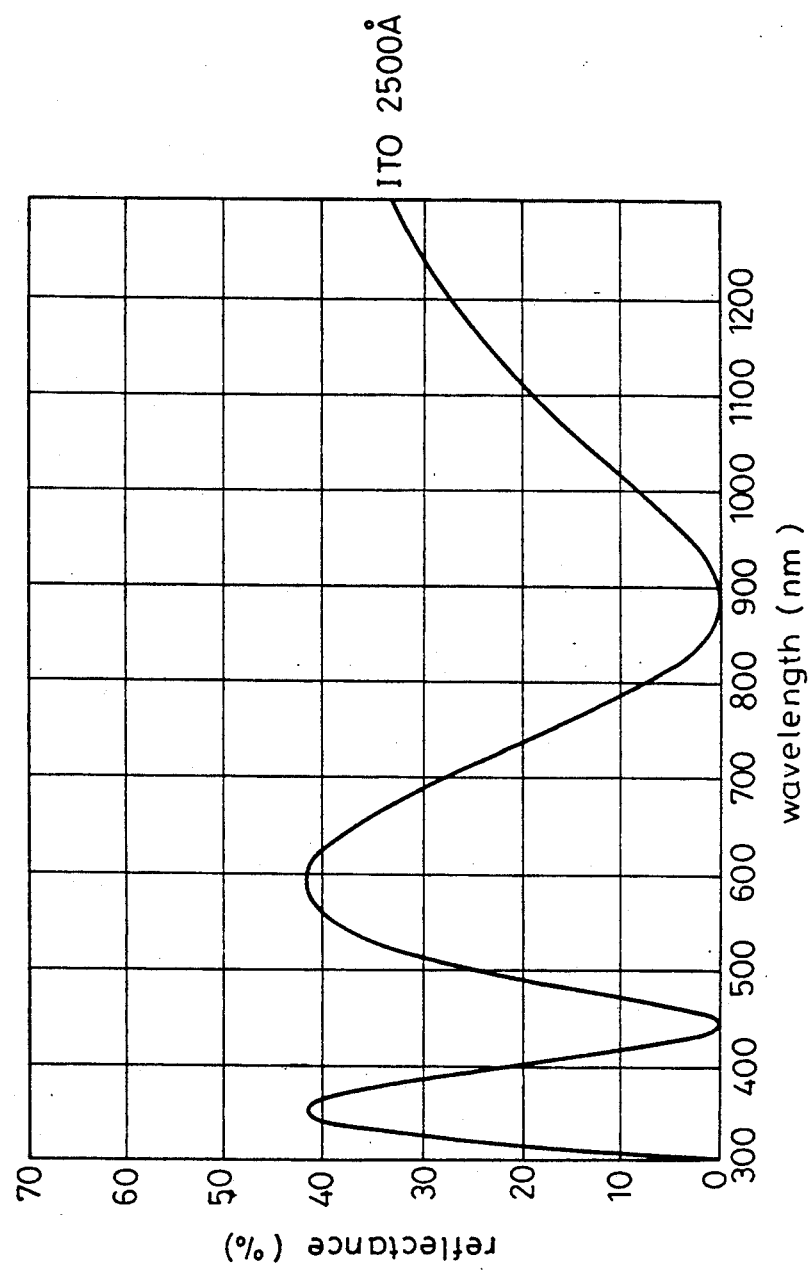
FIG. 2 is a diagram showing the reflection characteristics of the photovoltaic device of FIG. 1 in which an ITO film 2500 Angstroms thick is used as a selective reflection film.
Figure 6:
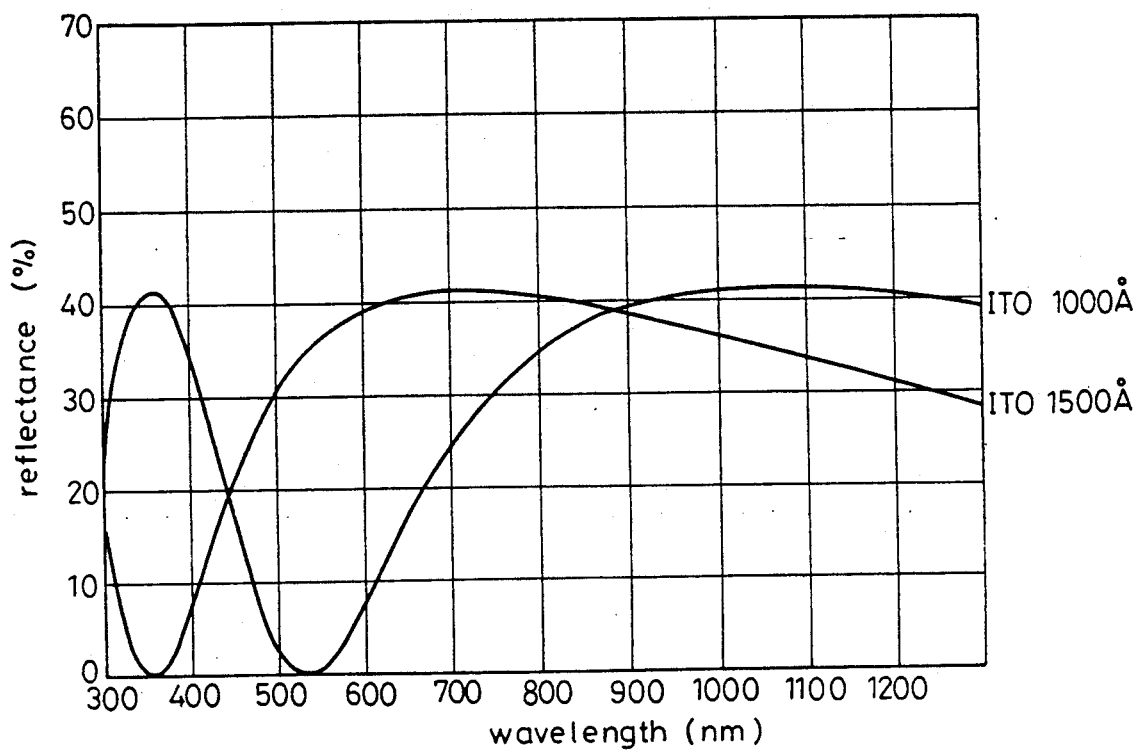
FIG. 6 is a diagram showing the reflection characteristics of a prior art device in which an ITO film 1000 to 1500 Angstroms thick is used as a selective reflection film.
Figure 7:
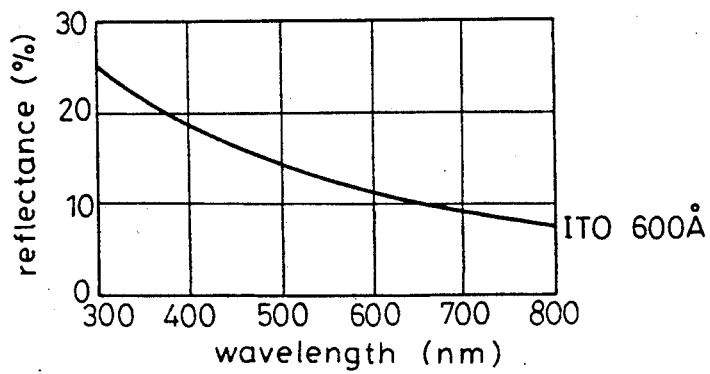
FIG. 7 is a diagram showing the reflection characteristics of a prior art device in which an ITO film about 600 Angstroms thick is used as a selective reflection film.

FIG. 2 shows the calculated reflectance of the selective reflection film. As is apparent from the figure, by making the thickness of the ITO film about 2500 Angstroms, the reflection peak occurs at about 600 nm.

The reflectance is suppressed at wavelengths above 700 nm, i.e., wavelengths which can be absorbed by the first solar cell 11. The long wavelength light which theoretically cannot be absorbed by the second solar cell is effectively introduced into the first solar cell. In this manner, the photocurrent generated in the second solar cell 12 can be increased while suppressing any reduction in the photocurrent generated by the first solar cell 11. Thus, the photocurrents of the first and second solar cells can be kept balanced, thereby increasing the efficiency of the structure. Accordingly, the photocurrent density generated by the second solar cell increases to 17 to 19 $mA/cm^2$ and the conversion efficiency of the structure increases to 16 to 18% from the 14 to 16% of the prior art device.

While, in the above-described embodiment, an ITO film about 2500 Angstroms thick is used as the selective reflection film 8, the film thickness may be in a range of $2500 \pm 150$ Angstroms with the same effects as described above.

The material for the selective reflection film 8 may be any material which is electrically conductive and highly transparent to long wavelengths and the thickness of which may be controlled to an optimum value. For example, ZnO (n=1.41) $3200 \pm 150$ Angstroms thick, TiO (n=2.30) $1950 \pm 150$ Angstroms thick, or $SiO_2$ (n=2.0) $2250 \pm 100$ Angstroms thick may be used with the same effects as when ITO is used.

Figure 3:
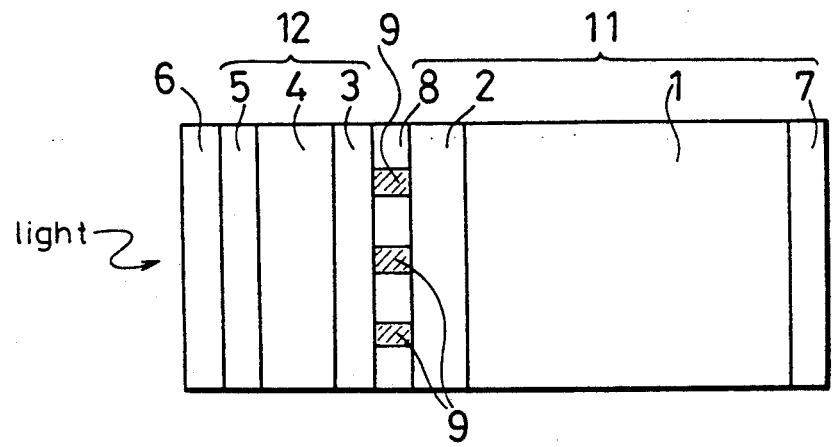
FIG. 3 is a cross-sectional view showing a multiple cell photovoltaic device according to a second embodiment of the present invention.
Figure 5:
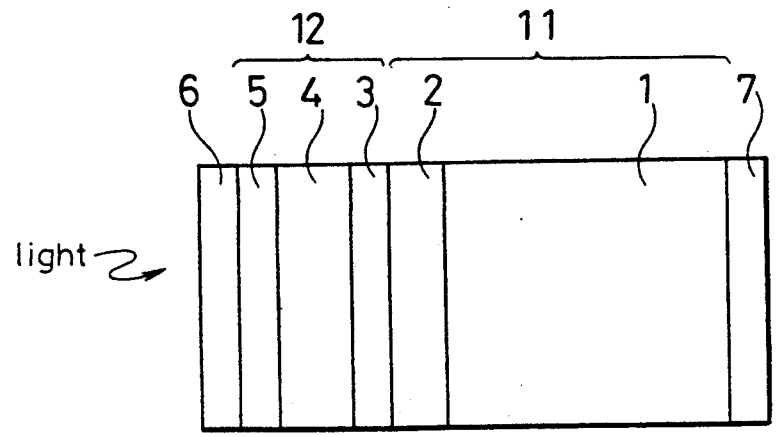
FIG. 5 is a cross-sectional view showing a prior art multiple cell photovoltaic device.

FIG. 3 shows a cross-sectional view of a multiple cell photovoltaic device according to a second embodiment of the present invention. In FIG. 2, the same reference numerals designate the same or corresponding elements as those shown in FIG. 1. Reference numeral 9 designates apertures in the selective reflection film 8. In this second embodiment, the selective reflection film 8 comprises $SiO_2$ 3100 Angstroms thick. When the selective reflection film 8 is a dielectric material, such as $SiO_2$, inserted between the first solar cell 11 and the second solar cell 12, the two solar cells cannot be electrically connected in series. Therefore, apertures 9 are provided in the selective reflection film 8 to electrically connect the solar cells.

The light is incident on the second solar cell 12 through the transparent electrode 6. Almost all the short wavelength light, i.e., below about 500 nm in wavelength, is absorbed therein and the longer wavelength light is transmitted through the second solar cell 12. Only light of wavelengths which can be absorbed by the second solar cell is selectively reflected at the selective reflection film 8.

FIG. 4 shows the calculated reflectance of the selective reflection film. The calculation is obtained from the same formulae as used for the first embodiment. In this second embodiment, for simplifying the calculation, the selective reflection film is assumed to comprise $SiO_2$ of a refractive index of 1.46 which is between silicon films having refractive indices of 3.8. As is apparent from the figure, by making the thickness of the $SiO_2$ film about 3100 Angstroms, the reflection peak occurs at about 600 nm.

The reflectance can be suppressed for light of wavelengths above 700 nm, i.e., which can be absorbed by the first solar cell 11. The long wavelength light which theoretically cannot be absorbed by the second solar cell is effectively introduced into the first solar cell. In this manner, the photocurrent generated in the second solar cell 12 can be increased without decreasing the photocurrent generated in the first solar cell 11. Thus, the photocurrents of the first and second solar cells can be balanced, increasing the efficiency of the multiple cell photovoltaic device. Since the $SiO_2$ film is superior in reflection and transparency characteristics to an ITO film, the photocurrent density increases to 18 to 20 $mA/cm^2$, and the conversion efficiency further rises to 17 to 19%.

In this second embodiment, the p-type polysilicon 1, the amorphous or microcrystalline silicon films 2 and 5, and the transparent electrode 6 are produced by the same methods as in the first embodiment. When the selective reflection film 8 is produced by screen printing using a substance, such as a silicone ladder polymer, the apertures 9 can be produced at the same time, thereby simplifying the production process. The apertures may be produced by a conventional photolithography technique after producing the dielectric films on the entire surface by other film production methods. The apertures may also be produced by masking during the deposition of the dielectric film.

While, in the above-described second embodiment, the selective reflection film comprises $SiO_2$ 3100 Angstroms thick, the film thickness may be in a range of 3100±150 Angstroms with the same effects as described above.

The material for the selective reflection film 8 may be any material which is electrically conductive and highly transparent to long wavelengths and the thickness of which may be controlled to an optimum value. For example, SiN (n=2.0) 2300±150 Angstroms thick, TaO (n=2.20) 2050±150 Angstroms thick, or SiC (n=2.59) 1750±150 Angstroms thick may be used with the same effects as when $SiO_2$ is used.

While, in the first and second embodiments described above, p-type polysilicon is used for the first solar cell, p-type monocrystalline silicon may be used therefor with the same effect as described above. Al is used for the rear surface electrode in the first and second embodiments described above. However, metals other than Al, for example, Ag, Au, Ni, Cu, Ti, Cr, or Pd may be used elementally or in an alloy as the rear surface electrode.

As is evident from the foregoing description, according to the present invention, a conductive selective reflection film having a thickness such that short wavelength light which is absorbed by the second solar cell is selectively reflected and that long wavelength light which is not absorbed by the second solar cell and is absorbed by the first solar cell is transmitted therethrough is inserted between first and second serially connected solar cells. Therefore, the photocurrent generated in the second solar cell is increased without reducing the photocurrent generated in the first solar cell, thereby balancing the photocurrents generated in the respective cells. Accordingly, the conversion efficiency of the multiple cell photovoltaic device rises to 16 to 19% from 14 to 16%.

When the selective reflection film comprises a dielectric material, apertures are provided therein through which the first and second solar cells are electrically connected.

What is claimed is:

1. A multiple cell photovoltaic device comprising a second solar cell for receiving incident light, for absorbing relatively short wavelength light, for generating an electrical current in response, and for transmitting relatively long wavelength light and a first solar cell for absorbing relatively long wavelength light transmitted through said second solar cell and for generating an electrical current in response, said first and second solar cells being electrically in series, and an electrically conductive wavelength selective reflection film disposed between said first solar cell and said second solar cell wherein said wavelength selective reflection film has a thickness selected to provide a distinct reflection maximum at a relatively short wavelength of light that may be absorbed by said second solar cell and to provide a distinct transmission maximum at a relatively long wavelength of light that is not absorbed by said second solar cell and that may be absorbed by said first solar cell.

2. A multiple cell photovoltaic device as defined in claim 1 wherein said first and second solar cells are each formed of at least one of polycrystalline, amorphous, and microcrystalline silicon.

3. A multiple cell photovoltaic device as defined in claim 2 wherein said electrically conductive wavelength selective reflection film comprises an ITO film of 2500±150 angstroms thickness.

4. A multiple cell photovoltaic device as defined in claim 2 wherein said electrically conductive wavelength selective reflection film comprises a ZnO film of 3200±150 angstroms thickness.

5. A multiple cell photovoltaic device as defined in claim 2 wherein said electrically conductive wavelength selective reflection film comprises a TiO film of 1950±150 angstroms thickness.

6. A multiple cell photovoltaic device as defined in claim 2 wherein said electrically conductive wavelength selective reflection film comprises a $SnO_2$ film of 2250±100 angstroms thickness.

7. A multiple cell photovoltaic device as defined in claim 2 wherein said first solar cell comprises first conductivity type polycrystalline silicon and one of a second conductivity type amorphous and a microcrystalline silicon film, and said second solar cell comprises one of a first conductivity type amorphous and a microcrystalline silicon film, an intrinsic amorphous silicon film, and one of a second conductivity type amorphous and a microcrystalline silicon film, and including a transparent electrode disposed on said second conductivity type amorphous or microcrystalline silicon film of said second solar cell.

8. A multiple cell photovoltaic device as defined in claim 7 wherein said polycrystalline silicon is produced by one of casting, CVD, and LPE, said amorphous and microcrystalline silicon films are produced by one of PCVD, photo CVD, and ECR-CVD, and said transparent electrode is produced by one of sputtering and electron beam deposition.

9. A multiple cell photovoltaic device comprising a second solar cell for receiving incident light, for absorbing relatively short wavelength light, for generating an electrical current in response, and for transmitting relatively long wavlength light, and a first solar cell for absorbing relatively long wavelength light transmitted through said second solar cell and for generating an electrical current in response, said first and second solar cells being electrically connected in series, and a dielectric wavelength selective reflection film disposed between said first and second solar cells wherein said film includes a plurality of apertures through which said first and second solar cells are electrically connected in series and said wavelength selective reflection film has a thickness selected to provide a distinct reflection maximum at a relatively short wavelength of light that may be absorbed by said second solar cell and to provide a distinct transmission maximum at a relatively long wavelength of light that is not absorbed by said second solar cell and that may be absorbed by said first solar cell.

10. A multiple cell photovoltaic device as defined in claim 9 wherein said first and second solar cells are each formed of at least one of polycrystalline, amorphous, and microcrystalline silicon.

11. A multiple cell photovoltaic device as defined in claim 10 which said dielectric wavelength selective reflection film comprises a $SiO_2$ film of $3100\pm150$ angstroms thickness.

12. A multiple cell photovoltaic device as defined in claim 10 wherein said dielectric wavelength selective reflection film comprises a SiN film of $2300\pm150$ angstroms thickness.

13. A multiple cell photovoltaic device as defined in claim 10 wherein said dielectric wavelength selective reflection film comprises a TaO film of $2050\pm150$ angstroms thickness.

14. A multiple cell photovoltaic device as defined in claim 10 wherein said dielectric wavelength selective reflection film comprises a SiC film of $1750\pm150$ angstroms thickness.

15. A multiple cell photovoltaic device as defined in claim 9 wherein said dielectric wavelength selective reflection film is formed from a screen printed silicon ladder polymer.

* * * * *